United States Patent
Zhao et al.

(10) Patent No.: US 11,089,712 B2
(45) Date of Patent: Aug. 10, 2021

(54) VENTILATED SHIELD CAN

(71) Applicant: Microsoft Technology Licensing, LLC, Redmond, WA (US)

(72) Inventors: Tianyu Zhao, Kirkland, WA (US); Eugene Lee, Kenmore, WA (US); Bo Dan, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/358,187

(22) Filed: Mar. 19, 2019

(65) Prior Publication Data
US 2020/0305305 A1 Sep. 24, 2020

(51) Int. Cl.
*H05K 7/20* (2006.01)
*H05K 1/02* (2006.01)
*H05K 9/00* (2006.01)
*G06F 1/20* (2006.01)

(52) U.S. Cl.
CPC ......... *H05K 7/20145* (2013.01); *G06F 1/203* (2013.01); *H05K 1/0209* (2013.01); *H05K 7/20172* (2013.01); *H05K 9/0024* (2013.01); *H05K 9/0032* (2013.01)

(58) Field of Classification Search
CPC ........... H05K 9/00; H05K 9/002–0035; H05K 7/20145; H05K 7/20172; H05K 1/0209; H05K 1/0218; H05K 2201/10098; Y10S 174/35; H01R 13/6594–6597; H01Q 1/526
USPC ............................. 361/800, 816, 841, 679.48
See application file for complete search history.

(56) References Cited

U.S. PATENT DOCUMENTS

| | | | | |
|---|---|---|---|---|
| 4,481,525 A | * | 11/1984 | Calabro | H01L 23/4093 174/16.3 |
| 4,754,101 A | * | 6/1988 | Stickney | H05K 9/0032 174/383 |
| 4,838,475 A | * | 6/1989 | Mullins | H05K 3/341 174/361 |

(Continued)

FOREIGN PATENT DOCUMENTS

CN 201430524 Y 3/2010
WO 2018005425 A2 1/2018

OTHER PUBLICATIONS

"Our range of EMI Shielding Materials" EEMC Coimex, retrieved on Nov. 20, 2018 from https://www.eemc.nl/en/products/emc-components/emi-shielding/ (7 pages).

(Continued)

*Primary Examiner* — Zachary Pape
*Assistant Examiner* — Amir A Jalali
(74) *Attorney, Agent, or Firm* — Holzer Patel Drennan (57) ABSTRACT

A device cooling system disclosed herein includes a ventilated shield can coupled to a printed circuit board assembly. The ventilated shield can includes a first side surface with input holes and a second side surface with output holes. The ventilated shield can is positioned related to a predefined airflow path such that the input holes and the output holes facilitate airflow along the predefined airflow path through the ventilated shield can in a direction substantially parallel to the PCBA while the shield can encases and shields at least one electrical component from RF radiation at a target shield frequency.

16 Claims, 4 Drawing Sheets

(56) References Cited

U.S. PATENT DOCUMENTS

| | | | | |
|---|---|---|---|---|
| 5,285,350 | A * | 2/1994 | Villaume | H01L 23/3672 165/80.3 |
| 5,614,694 | A * | 3/1997 | Gorenz, Jr. | H05K 9/0026 174/375 |
| 6,226,182 | B1 | 5/2001 | Maehara | |
| 6,320,121 | B1 * | 11/2001 | Honeycutt | H05K 9/0032 174/371 |
| 6,324,075 | B1 * | 11/2001 | Unrein | G06F 1/182 174/365 |
| 6,947,294 | B2 | 9/2005 | Lin | |
| 7,113,740 | B2 | 9/2006 | Kuchiishi | |
| 7,535,711 | B2 * | 5/2009 | Saegusa | G01P 13/006 353/52 |
| 7,629,674 | B1 * | 12/2009 | Foster | H01L 21/56 257/659 |
| 7,638,717 | B1 * | 12/2009 | Yeates | H05K 9/0032 174/377 |
| 8,520,405 | B2 * | 8/2013 | Yukiyoshi | H05K 9/0054 361/816 |
| 8,824,142 | B2 * | 9/2014 | Jewell-Larsen | G06F 1/203 165/104.33 |
| 9,513,675 | B2 | 12/2016 | Nicol | |
| 10,117,324 | B2 | 10/2018 | Wang | |
| 10,653,048 | B1 * | 5/2020 | Green | H05K 1/111 |
| 2002/0166683 | A1 * | 11/2002 | Shlahtichman | H05K 9/0032 174/363 |
| 2002/0185294 | A1 | 12/2002 | Shlyakhtichman et al. | |
| 2003/0117786 | A1 | 6/2003 | Chang et al. | |
| 2003/0223211 | A1 * | 12/2003 | Huang | H05K 9/0032 361/816 |
| 2003/0223213 | A1 * | 12/2003 | Daoud | H05K 9/0026 361/818 |
| 2007/0094977 | A1 * | 5/2007 | Zuehlsdorf | H04B 1/40 52/480 |
| 2007/0242431 | A1 * | 10/2007 | Kuo | H01L 23/467 361/695 |
| 2009/0002949 | A1 * | 1/2009 | Pawlenko | H05K 7/20445 361/707 |
| 2009/0119903 | A1 | 5/2009 | Luehlsdorf et al. | |
| 2010/0061577 | A1 * | 3/2010 | Yeates | H04R 17/00 381/337 |
| 2011/0091051 | A1 * | 4/2011 | Thomason | G06F 1/1688 381/103 |
| 2011/0266045 | A1 * | 11/2011 | Xiong | H05K 9/0032 174/350 |
| 2011/0299262 | A1 * | 12/2011 | Crotty | H01R 13/6271 361/818 |
| 2012/0044663 | A1 * | 2/2012 | Lu | H05K 9/0026 361/818 |
| 2012/0224341 | A1 * | 9/2012 | Hsieh | H05K 9/0032 361/760 |
| 2013/0003300 | A1 | 1/2013 | Fu et al. | |
| 2013/0048369 | A1 * | 2/2013 | Malek | H05K 9/0032 174/377 |
| 2013/0050950 | A1 * | 2/2013 | Hill | H05K 9/0032 361/720 |
| 2013/0277010 | A1 * | 10/2013 | Lin | G06F 1/20 165/80.2 |
| 2014/0218851 | A1 * | 8/2014 | Klein | H05K 3/20 361/679.02 |
| 2015/0305210 | A1 * | 10/2015 | Yu | H01L 23/552 361/767 |
| 2016/0044835 | A1 * | 2/2016 | Lee | H05K 1/0216 361/760 |
| 2017/0071063 | A1 * | 3/2017 | Sizemore | H05K 7/1418 |
| 2017/0325365 | A1 * | 11/2017 | Kuk | H05K 9/0022 |
| 2017/0354060 | A1 * | 12/2017 | Pedoeem | H05K 7/20145 |
| 2018/0007783 | A1 * | 1/2018 | Crotty, Jr. | H05K 9/0032 |
| 2018/0042135 | A1 * | 2/2018 | Tamaki | A63F 13/90 |
| 2018/0116077 | A1 * | 4/2018 | Chang | H05K 1/0218 |
| 2018/0206353 | A1 * | 7/2018 | Briant | H05K 5/0247 |
| 2018/0240757 | A1 * | 8/2018 | Wong | H01L 21/4857 |
| 2018/0249599 | A1 * | 8/2018 | Kim | H05K 9/0032 |
| 2019/0014696 | A1 * | 1/2019 | Choi | H05K 9/0037 |
| 2019/0191597 | A1 * | 6/2019 | Han | H01Q 3/08 |
| 2019/0200487 | A1 * | 6/2019 | Coteus | H05K 7/1489 |

OTHER PUBLICATIONS

"International Search Report and Written Opinion Issued in PCT Application No. PCT/US20/022209", dated Jun. 17, 2020, 12 Pages.

* cited by examiner

VENTILATED SHIELD CAN

BACKGROUND

As mobile electronic devices continue to decrease in size, heat-generating components are placed in closer proximity. Some devices may include one or more fans to circulate air within a device enclosure, such as throughout the gap formed between a lid of the device enclosure and various components mounted to a printed circuit board within the device enclosure. However, the size of this gap is strained by consumer demands for a thinner mobile electronics. Ongoing efforts to decrease device thickness create challenges pertaining to heat dissipation and impedance mitigation within small mobile electronics.

SUMMARY

A device cooling system includes a ventilated shield can attached to a printed circuit board assembly (PCBA). The PCBA is oriented within a plane substantially perpendicular to a direction of gravity and the ventilated shield can includes input holes and output holes positioned to facilitate airflow through the shield can in a direction substantially parallel to the PCBA while shielding at least one internal electrical component from radiation at a target shield frequency.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. These and various other features and advantages will be apparent from a reading of the following Detailed Description.

DETAILED DESCRIPTION

Within mobile device enclosures, sensitive circuit components may be encased in metal shields or "cans" that offer protection from electro-magnetic interference (EMI) and radio frequency interference (RFI). For example, a shield can may be utilized to encase individual components against a printed circuit board (PCB) of a device, such as to encase RF-emitting components as well as sensitive electrical components likely to be affected by EMI or RFI. Although shield cans traditionally have a low profile relative to the thickness of the enclosures in which they are placed, consumer demand for thinner devices places a strain on the size of gaps that may be included to provide airflow between such components and the device enclosure.

The technology disclosed herein includes a ventilated shield can design that may be placed within a cooling system airflow path without obstructing or diverting the airflow while also providing EM and RF shielding at a target shield frequency. According to one implementation, the design includes ventilation holes sized to prevent RF leak while still maximizing throughput of air into and out of the ventilated shield can. Still other implementations provide ventilated shield cans with structural perimeter features that offer robust resistance to deformation to compensate for structural vulnerabilities that may otherwise result from the introduction of open space in the shield can perimeter facilitating airflow in and out of the shield can.

Figure 1:
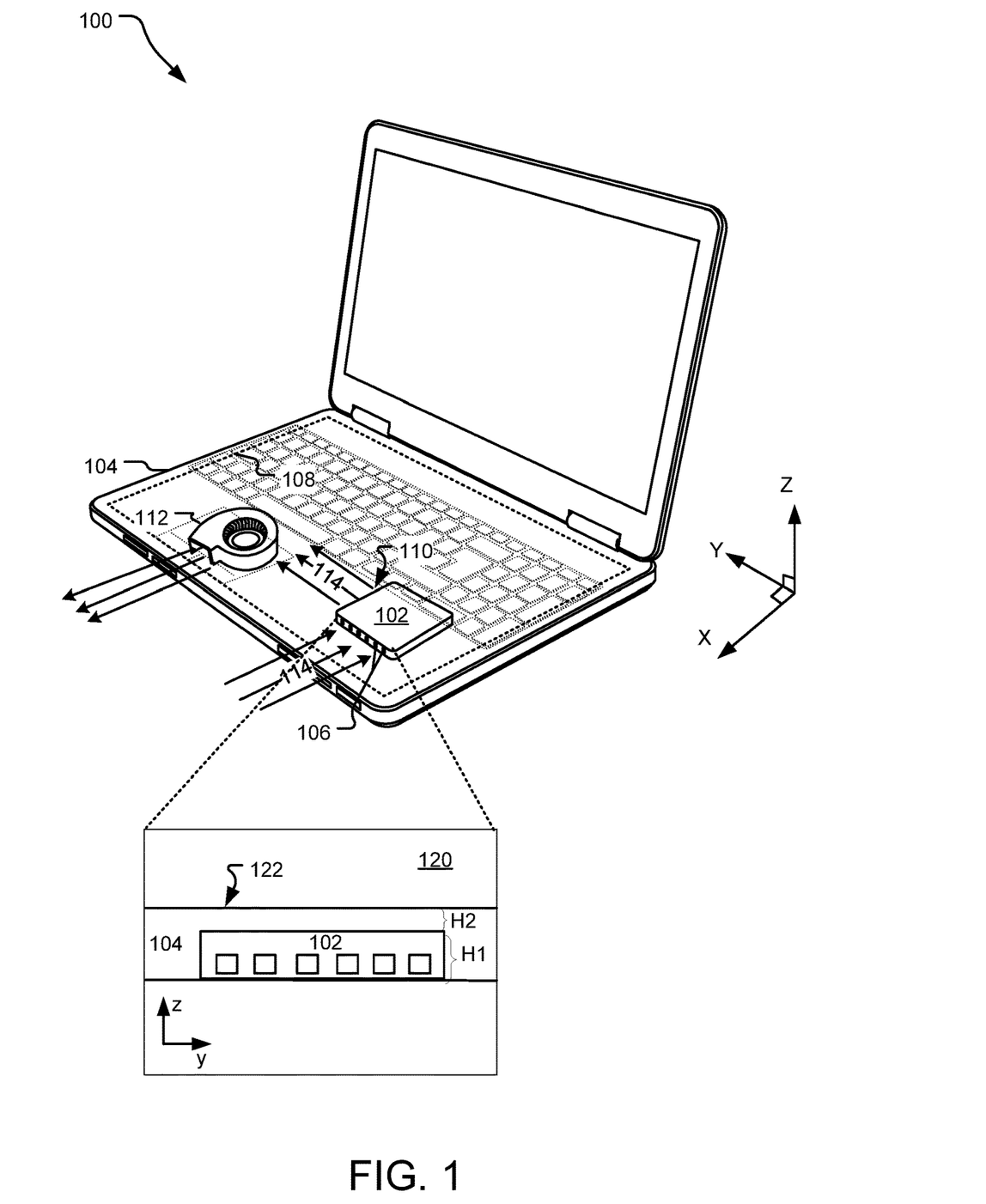
FIG. 1 illustrates an example electronic device including a ventilated shield can encasing one or more electrical components within a device enclosure.

FIG. 1 illustrates an example electronic device 100 including a ventilated shield can 102 encasing one or more electrical components (not shown) within a device enclosure 104. The ventilated shield can 102 is attached to a printed circuit board assembly (PCBA) 108 of the electronic device 100 and encases at least once RF source component or an RF-susceptible electrical component. In the following description, the term "RF source component" refers to a component that generates electromagnetic radiation that may, if not contained, interfere with the functionality of other electronic components. For example, the ventilated shield can 102 may be utilized to isolate a microprocessor from its surroundings. In contrast, an "RF susceptible component" is a non-emitting electrical component that is likely to be affected by EMI or RFI, such as circuit inputs, amplifier stages, cables and wires sensitive to cross-talk, etc. In different implementations, the ventilated shield can 102 may be used in different ways.

In one implementation, the ventilated shield can 102 encases a processor of the electronic device 100, such as to encompass a system on chip (SOC) while isolating the SOC from other circuitry on the PCBA 108. In other implementations, the ventilated shield can 102 encases one or more RF susceptible components such as wires or cables in proximity to an RF emitting component including, for example, memory (e.g., one or more DDRs), voltage regulators, inductors, etc.

In one implementation, the ventilated shield can 102 is a hollow or substantially hollow enclosure formed of a conductive or magnetic material that blocks transmission of extraneous electro-magnetic and radio frequency emissions. Although the ventilated shield can 102 may be formed of a variety of magnetic and/or electrically conductive materials, the ventilated shield can 402 is, in one implementation, a heat conductive material such as copper. Consequently, the ventilated shield can 102 may acts as a heat spreader, passively spreading heat for cooling.

The ventilated shield can 102 includes ventilation holes (e.g., input holes 106 and output holes 110) on at least two different side surfaces. According to one implementation, the input holes 106 and the output holes 110 are formed on surfaces that define the thinnest dimension of the ventilated shield can 102 (e.g., the surfaces parallel to the Z-axis of FIG. 1). Additionally, the ventilated shield can 102 may be integrated within the electronic device 100 such that the thinnest dimension of ventilated shield can 102 is substantially parallel to the thinnest dimension of the electronic device 100.

According to one implementation, the electronic device 100 includes an active cooling system that includes a fan 112 within the device enclosure 104 at a location external to the ventilated shield can 102. The fan 112 is mounted within the device enclosure 104 (e.g., either to a wall of the device enclosure 104 or to the PCBA 108) and circulates air along a path 114 extending throughout the device enclosure 104 in a direction substantially parallel to the PCBA 108 and perpendicular to the direction of gravity. In different implementations, the positioning of the fan 112 and ventilated shield can 102 may vary within the device enclosure 104 across a range of positions including positions directly below (along the Z-axis) a device keyboard as well as positions below a touch pad area below a keyboard (e.g., as generally shown with respect to FIG. 1).

In FIG. 1, the ventilated shield can 102 is positioned with the input holes 106 and the output holes 110 in the path 114 such air may flow in and out of the ventilated shield can 102 without being diverted from the natural path that the air would follow if the ventilated shield can 102 were excluded from the device design. As used herein, the terms "substantially perpendicular" and "substantially parallel" generally refer to directions that are within 5% of actual perpendicular and parallel.

In different implementations, the input holes 106 and the output holes 110 may assume a variety of different shapes, sizes, and spacings relative to one another; however, the input holes 106 and the output holes 110 are operable to prevent RF leak through the ventilated shield can 102 at a target shielding frequency. For example, the target shielding frequency may correspond to the frequency of emissions generated by a component encased by the ventilated shield can 102 or, instead, to an emission frequency of a component within the device enclosure that is external to the ventilated shield can 102. According to one implementation, the input holes 106 and the output holes 110 each have a maximum dimeter that is less than 2.5 mm to provide RF shielding at 2.4 GHz.

Although the input holes 106 and the output holes 110 are small enough to prevent RF leak at the target shielding frequency, the number and spacing of such holes may, in some implementations, be selected so as to maximize or nearly maximize the amount of open space in the corresponding sides of the ventilated shield can 102 that can be achieved without compromising the aforementioned shielding capabilities. For example, the ventilated shield can 102 may be designed so as to provide for maximum air throughput along the path 114 while still preventing RF leak through the ventilation holes at the target shielding frequency.

In still other implementations, the input holes 106 and the output holes 110 are sized and spaced to prevent RF leak and maximize air throughput along the path 114 while also being sized and positioned such that the side surfaces of the ventilated shield can 102 can adequately support the weight of the ventilated shield can 102 and withstand deformation as a result of forces applied thereto during use of the electronic device 100. For example, the ventilated shield can 102 may be designed to be structurally robust and withstand a Z-direction force of predetermined magnitude so as to ensure that shape and functionality of the ventilated shield can 102 is not compromised when a user subjects the electronic device 100 to impact or shock, such as by dropping the device. Exemplary features that may be incorporated to increase mechanical rigidity of the ventilated shield can 102 are described in greater detail with respect to FIGS. 2-3.

The above-described design decreases impedance within the device enclosure 104 and increases heat dissipation as compared to devices that implement traditional shield cans that impede and redirect air flows.

Dimensions of the ventilated shield can 102 may vary considerably from one implementation to another; however, A height dimension of the ventilated shield can may be made large enough such that the inner dimension (H1) through the shield can 102 is greater than a corresponding height (H2) of a gap between the top of the ventilated shield can 102 and an upper side (e.g., lid 122) of the device enclosure 104, as shown in exploded view 120.

Although the electronic device 100 is shown to include the single ventilated shield can 102, other implementations of the disclosed technology may include multiple different ventilated shield cans with their respective input and output holes positioned in-line with a defined airflow path internal to the device enclosure 104. For example, the defined airflow path may be a path that is formed due to the inclusion of multiple fans within the electronic device.

Figure 2:
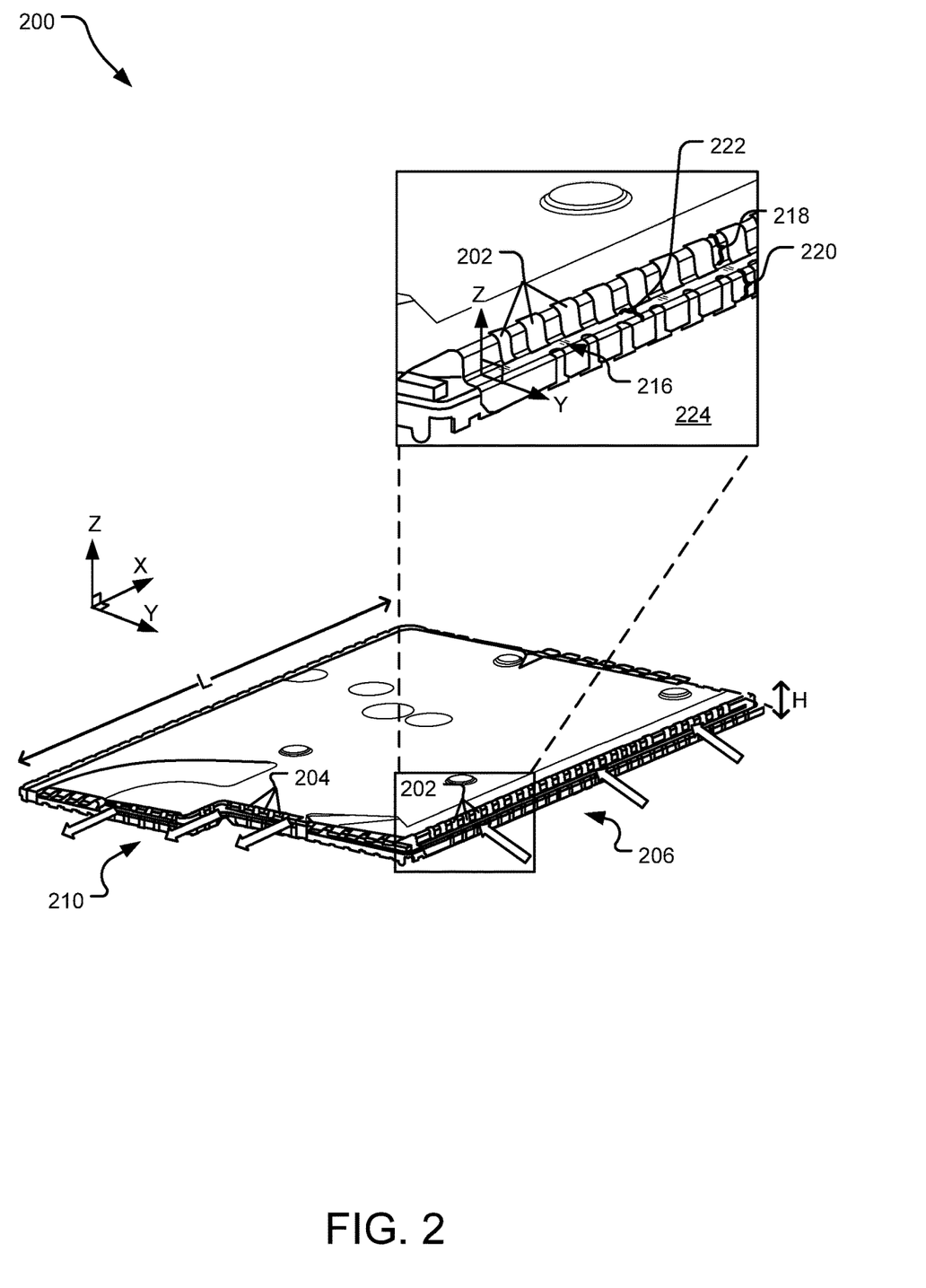
FIG. 2 illustrates another example ventilated shield can.

FIG. 2 illustrates another example ventilated shield can 200. The ventilated shield can 200 has a longest dimension (L) adapted to rest parallel to a PCBA (not shown). In one implementation, the ventilated shield can 200 is integrated within an electronic device such that the longest dimension (L) of the ventilated shield can 200 rests horizontal within the electronic device and perpendicular to the direction of gravity. The ventilated shield can 200 includes input holes 202 along a first side surface 206 and output holes 204 along a second side surface 210. According to one implementation, the first side surface 206 and the second side surface 208 define a thinnest dimension (e.g., dimension H) of the ventilated shield can 200 that is substantially aligned in the direction of gravity such that the input holes 202 and the output holes 204 promote airflow through a device enclosure in along a plane generally perpendicular to the pull of gravity.

In FIG. 2, the first side surface 206 including the input holes 202 is adjacent to (forms a corner with) the second side surface 210 including the output holes 204. This promotes airflow along a substantially curved path (e.g., in through the first side surface 206 and out through the second side surface 210). However, in other implementations, the input holes 202 and the output holes 204 are on opposite sides of the ventilated shield can 200. For example, air may enter the ventilated shield can 200 through the input holes 202 on a first side and exit through output holes on a second opposite side.

In one implementation, the ventilated shield can 200 is designed to have the input holes 202 and the output holes 204 aligned along a target flow path of air within a device enclosure, such as in the manner shown and described with respect to FIG. 1. Although the input holes 202 and the output holes 204 may assume a variety of shapes, sizes, and spacings relative to one another, the input holes 202 and output holes 204 of FIG. 2 are substantially rectangular and spaced such that the amount of open space along the side surfaces 206 and 210 exceeds the amount of non-open space. According to one implementation, between 50% and 60% of the surface area on the first side surface and the second side surface consists of open space through which air may readily circulate in and out of the ventilated shield can 200. In some implementations, this percentage of open space may be higher or lower, depending on the desired structural strength (e.g., robustness and resistance to deformation) of the ventilated shield can 200. In one implementation, the input holes 202 and output holes 204 are confined to a portion of the ventilated shield can 200 that intersects a defined airflow path. For example, the openings on the side surfaces of the ventilated shield can 200 may comprise a surface area that is greater than 50% of a surface area identified as intersecting the defined airflow path.

Although a total amount of open space on the first side surface 206 and the second side surface 210 may exceed the amount of non-open space on such surface, each individual one of the input holes 202 and the output holes 204 may still comply with applicable RF shielding requirements and provide RF shielding at a target shield frequency. For example, each individual one of the input holes 202 and the output holes 204 may have a maximum diameter that is less than 2.5 mm when shielding at a target shield frequency of 2.4 GHz.

According to one implementation, each of the input holes 202 and the output holes 204 has a maximum diameter that complies with (e.g., is less than or equal to) a defined "maximum working shield diameter," which represents a maximum diameter that an individual hole may assume while still being guaranteed to block RF waves at the target shield frequency. In one such implementation, a size of each individual hole is maximized or nearly maximized while still complying with the maximum working shield diameter for the target shield frequency. For example, the inputs holes 202 and the output holes 204 each have a maximum diameter that is between about 90% and 100% of the maximum working shield diameter with given manufacturing tolerance. In one example implementation where the target shield frequency is 2.4 GHz and the maximum working shield diameter is 2.5 mm, the input holes 202 and the output holes 204 are designed to be 2.3 mm in diameter assuming an additional 0.2 mm tolerance due to product-to-product inconsistencies during the build phase. In another implementation, this tolerance ranges from plus or minus about 5-10% of the target hole size.

Without additional structural features shown in FIG. 2 and discussed below, the introduction of the input holes 202 and the output holes 204 in side edges of the ventilated shield can 200 may have the effect of reducing the amount of surface area along the side edges of the ventilated shield can 200 that is available to ground the ventilated shield can 200 within a device enclosure. Additionally, this decrease in the surface area of shielding material along the first side surface 206 and the second side surface 210 may have the effect of weakening the structural resistance to deformation when subjected to Z-direction forces.

In the illustrated implementation, these challenges (e.g., reduced contact area for grounding and susceptibility to structural deformation) are addressed by incorporating a step feature 216 in each of the first side surface 206 and the second side surface 210. Exploded view 224 shows the step feature 216 in greater detail. Although the exploded view 224 shows the step feature 216 as it appears on the side surface 206, the step feature 216 may have the same or similar features along the side surface 210.

The step feature 216 divides the first side surface 206 into a top portion 218, a bottom portion 220, and a central portion 222. The top portion 218 is offset from the bottom portion 220 by a distance in along the Y-axis. The central portion 222 serves to adjoin the top portion 218 to the bottom portion 220 and extends in a direction that may be perpendicular to the top portion 218 and the bottom portion 220. In one implementation, the ventilated shield can 200 is attached to a PCBA within a device enclosure such that each of the top portion 218 and the bottom portion 220 are substantially perpendicular to the PCBA and the central portion 222 is substantially parallel to the PCBA.

Inclusion of the step feature 216 provides several advantages. First, the step feature 216 effectively increases an amount of surface area that is available to establish contact with a grounded substructure (not shown). This increased area of contact (e.g., between the central portion 222 and an underlying substructure) provides better grounding of the ventilated shield can 200. Additionally, the step feature 216 increases a strength of the ventilated shield can along the Z-axis, effectively mitigating a likelihood that the structure may deform when subjected to Z-direction forces, such as impact or shock.

Dimensions of the ventilated shield can 200 may vary considerably from one implementation to another; however, the height dimension (H) may be made large enough such that the inner dimension (H) through the shield can 200 is greater than a corresponding height of a gap between the top of the ventilated shield can 200 and a lid of a device enclosure. In one example implementation, the shield can 200 has a height (H) of 3.55 mm, while the corresponding gap between the top of the ventilated shield can 200 and an enclosure lid is 0.3 mm.

Figure 3:
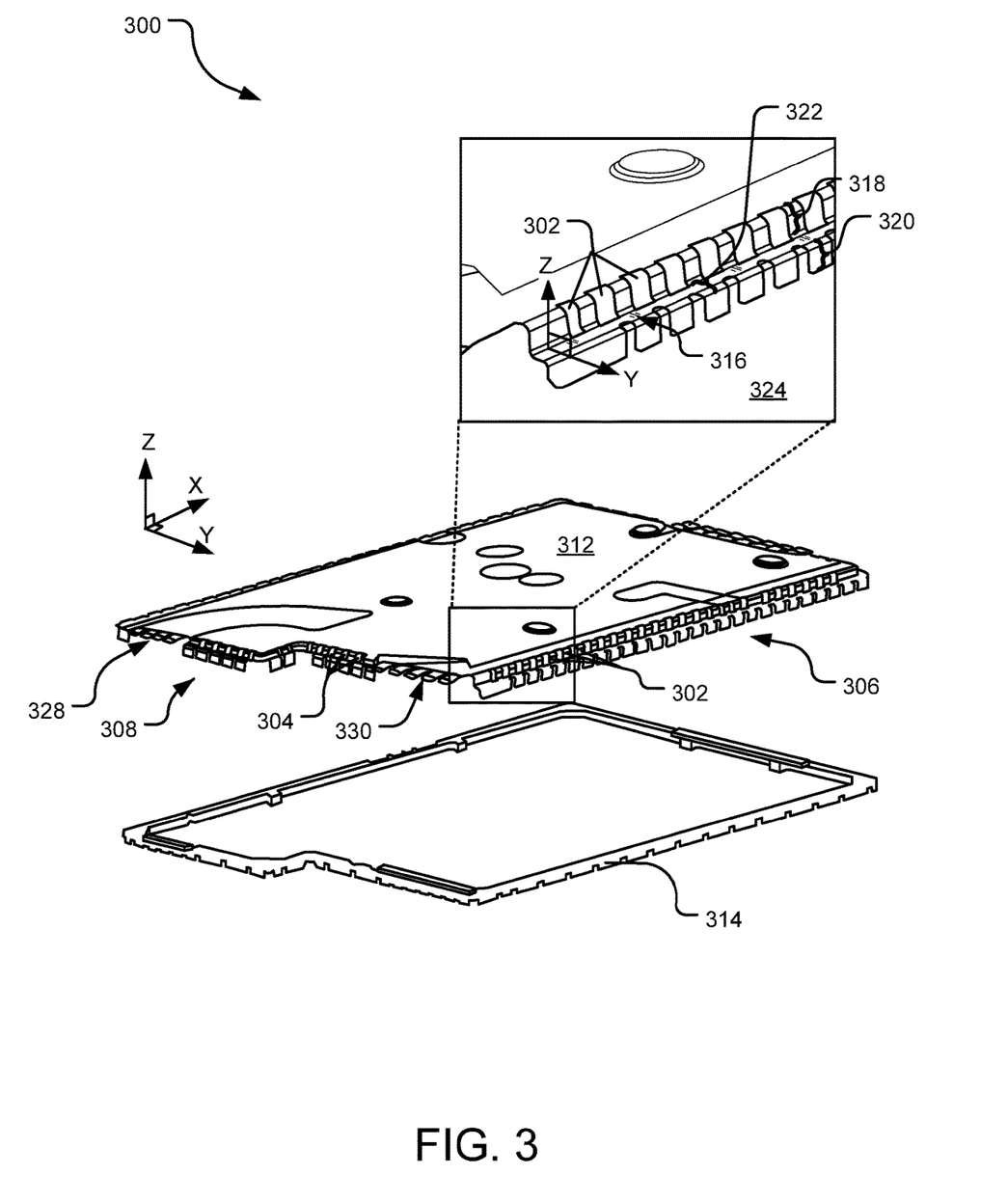
FIG. 3 illustrates an expanded view of another example ventilated shield can.

FIG. 3 illustrates still another example ventilated shield can 300 including a body 312 and a fence portion 314. In one implementation, the ventilated shield can 300 is the same as the ventilated shield can 200 shown in FIG. 2. The body 312 includes a lid and four side surfaces (e.g., illustrated side surfaces 306 and 308) designed to removably couple to the fence portion 314. In one implementation, the fence portion 314 is mounted to a PCBA of an electronic device and the body 312 includes an attachment mechanism that allows a user to lock the body 312 in place against the fence portion 314. For example, the body 312 of the ventilated shield can 300 may have a perimeter that is sized to snap into place and to secure the structure to the fence portion 314, such as by causing a dimple formed in one or more tabs on the body 312 to lock into a corresponding latch formed on the fence portion 314.

The ventilated shield can 300 includes input holes 302 along the first side surface 306 of the body 312 and output holes 304 along the second side surface 306 of the body 312. In one implementation, the ventilated shield can 300 is designed to have the input holes 302 and the output holes 304 aligned along a target flow path of air within a device enclosure, such as in the manner shown and described with respect to FIG. 1. Although the input holes 302 and the output holes 304 may assume a variety of shapes, sizes, and spacings relative to one another, the input holes may be sized and spaced such that the amount of open space intersecting an airflow path along the side surfaces 306 and 308 exceeds the amount of non-open space. Additionally, each of the individual holes is sized to be small enough to comply with applicable RF shielding requirements to provide RF shielding at a target shield frequency.

As visible in exploded view 324, the ventilated shield can 300 includes a step feature 316 in the side surface 306 of the body 312. The step feature 316 is includes a top portion 318 and a bottom portion 320 that each extend parallel to the Z-axis and rest in contact with sides of the fence portion 314 when the body 312 is coupled to the fence portion 314. A central portion 322 of the step feature 316 lays flat in the X-Y plane (e.g., parallel to a device PCBA, not shown) and contacts a top edge of the fence portion 314 when the body 312 is coupled to the fence portion 314.

Since the fence portion 314 may be grounded by the PCBA (not shown), a region of contact between the central portion 322 of the step feature 316 and the fence portion 314 ensures that the body 312 remains grounded while also making the structure more robust and increasing its ability to resist deformation under forces due to impact, vibration, and other shock events.

Specific features of the body 312 and fence portion 314 may differ in various implementations due to the intended use of the ventilated shield can 300. For example, the body 312 in the ventilated shield can 300 is shown to include tabs (spring fingers) 328 and 330 designed to match a profile of an underlying component (not shown), such as to make contact with and ground the body 312 against the component. Other aspects of the ventilated shield can 300 not specifically described above may be the same or similar to the ventilated shield cans described with respect to FIGS. 1 and 2.

Figure 4:
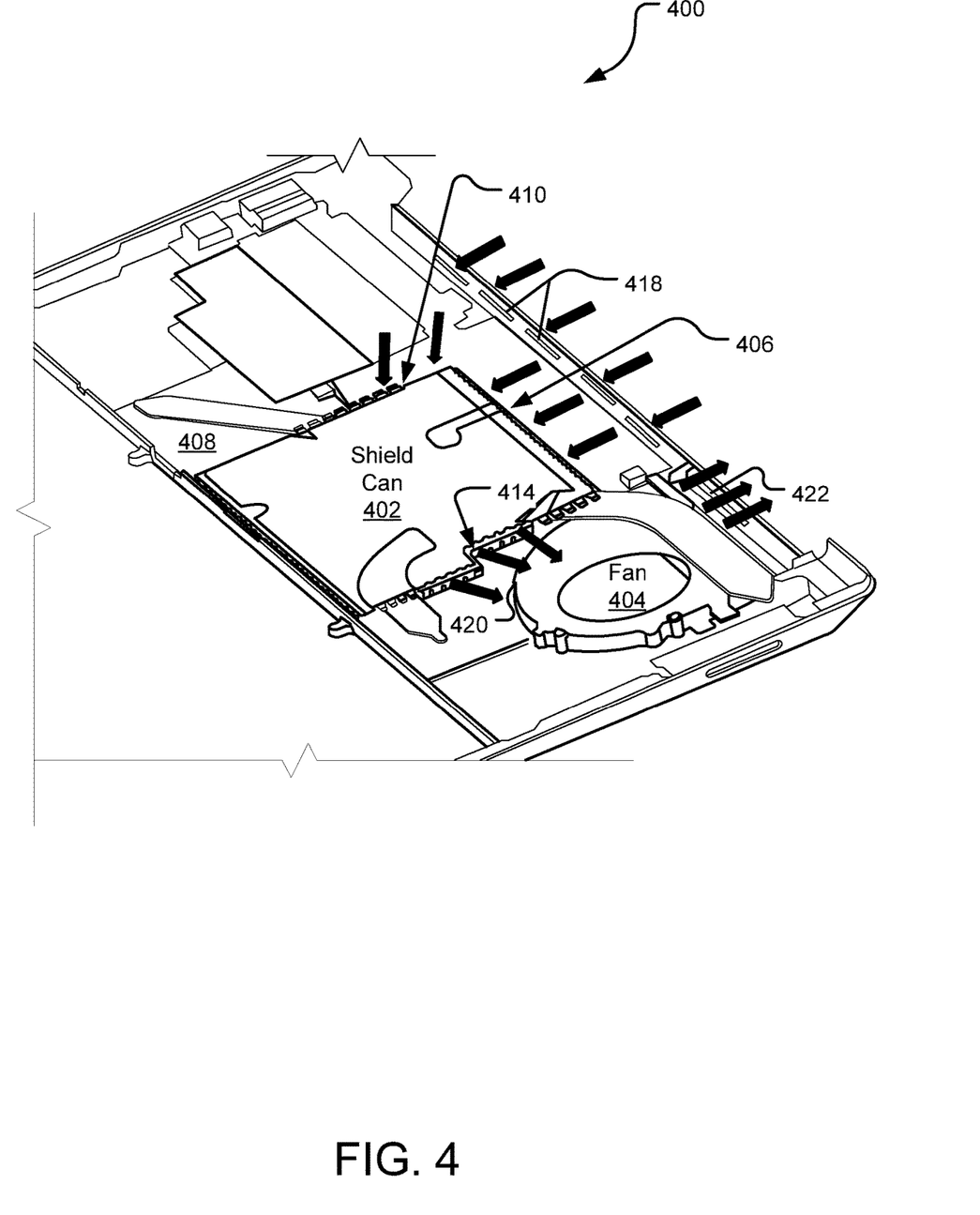
FIG. 4 illustrates an example device casing with an active cooling system including a ventilated shield can.

FIG. 4 illustrates an example device casing 400 with an active cooling system. The active cooling system includes a fan 404 and a ventilated shield can 402 to promote circulation of air moved by the fan 404 throughout the device casing along a path (marked by arrows in FIG. 4). The ventilated shield can 402 includes input holes on one or more side surfaces (e.g., input holes formed on side surfaces 406 and 410) and output holes formed on one or more side surface (e.g., output holes formed on a side surface 414).

The number, placement, and size of ventilation holes in the ventilated shield can 402 may vary from one implementation to another based on the arrangement of elements within the device casing 400 and the active cooling system. However, in one implementation, the ventilated shield can 402 is designed to accommodate airflow along a pre-identified airflow path through device casing 400 (e.g., in a direction parallel to the PCBA 408). The pre-identified airflow path (also referred to herein as a "natural airflow path") may, for example, be the airflow path that would exist within the device casing 400 due to the placement and orientation of the fan (e.g., the placement and orientation of the fan's intake and outtake locations) as well as to the size and location of available gaps within the device casing 400 assuming that the ventilated shield can 402 has no ability to obstruct or deflect airflow.

The ventilated shield can 402 is positioned within the device casing 400 such the inputs holes (e.g., the holes along the side surfaces 406 and 410) and the output holes (e.g., the holes along the side surface 414) are in-line with the pre-identified airflow path so as to promote airflow without deviation along the pre-identified airflow path. In the illustrated implementation, air enters the device casing 400 through vents 418; enters the ventilated shield can 402 through the input holes formed in the side surface 406 and 410; exits the ventilated shield can 402 through exits holes along the side surface 414; enters a fan intake 420; and is eventually pushed out of the device casing 400 by the fan 404 through outlets 422 in the device casing 400.

According to one implementation, each of the input holes and output holes is defined precisely according to RF shield requirements and has a maximum diameter equal to or less than a smallest diameter sufficient to block transmission of RF waves of a target shield frequency. If, for example, RF shield requirements mandate a hole size of 2.5 mm or smaller to block RF waves at a target shield frequency of 2.4 GHz, each of the input holes and output holes are individually constrained by this maximum diameter. According to one implementation, the ventilated shield can 402 is designed to shield at a frequency of emission of at least one RF-emitting component encased by the ventilated shield can 402. Other features of the ventilated shield can 402 not specifically described with respect to FIG. 4 may be the same or similar to those described with respect to FIGS. 1-3.

An example system disclosed herein includes a printed circuit board assembly (PCBA) extending within a plane substantially perpendicular to a direction of gravity; and a shield can attached to the PCBA. The shield can is adapted to shield at least one internal electrical component from radiation at a target shield frequency and includes input holes and output holes positioned to facilitate airflow through the shield can in a direction substantially parallel to the PCBA.

In another example system according to any preceding system, the input holes are formed in a first side surface of the shield can and the output holes are formed in a second side surface of the shield can. The first side surface and the second side surface define a thinnest dimension of the shield can.

In yet another example system according to any preceding system, the system includes an enclosure encompassing the PCBA and the shield can. The system also includes a fan within the enclosure and external to the shield can, the fan being adapted to move air throughout the enclosure along a defined airflow path passing through the input holes and the output holes of the shield can.

In still another example system of any preceding system, the input holes and the output holes have a maximum diameter equal to or less than a smallest diameter sufficient to block transmission of RF waves of a target shield frequency.

In yet still another example system of any preceding system, a surface area of openings formed by the input holes on the first side surface exceeds a surface area formed by non-open areas of the first side surface.

In another example system of any preceding system, the shield can comprises a body portion mounted to the PCBA and a fence portion including the input holes and the output holes. The fence portion is configured for attachment to the body portion.

In yet still another example system of any preceding system, the fence portion of the shield can include a step formed along at least one of a first side surface including the input holes and a second side surface including the output holes, the step including a first portion substantially parallel to the PCBA and a second portion substantially perpendicular to the PCBA.

In another example system of any preceding system, at least one of the input holes and the output holes are formed along the first portion of the step substantially perpendicular to the PCBA.

An example method disclosed herein includes determining an airflow path across a PCBA extending within a plane substantially parallel to a direction of gravity; and placing a shield can within the airflow path, the shield can having input holes and output holes in-line with the airflow path on different side surfaces of the shield can.

In another example method according to any preceding method, the input holes are formed in a first side surface of the shield can and the output holes are formed in a second side surface of the shield can. The first side surface and the second side surface define a thinnest dimension of the shield can.

In still another example method of any preceding method, the PCBA and the shield can are within an enclosure and the airflow path is created by a fan external to the shield can.

In yet still another example method of any preceding method, the input holes and the output holes have a maximum diameter equal to or less than a smallest diameter sufficient to block transmission of RF waves of a target shield frequency.

In another example method of any preceding method, a surface area of openings formed by the input holes on the first side surface exceeds a surface area formed by non-open areas of the first side surface.

In still another example method of any preceding method, the shield can includes a body portion mounted to the PCBA and a fence portion including the input holes and the output holes. The fence portion is configured for attachment to the body portion.

In yet still another example method of any preceding method, the fence portion of the shield can includes a step formed along at least one of a first side surface including the input holes and a second side surface including the output holes, the step including a first portion substantially parallel to the PCBA and a second portion substantially perpendicular to the PCBA.

In still another example method of any preceding method, at least one of the input holes and the output holes are formed along the first portion of the step substantially perpendicular to the PCBA.

An example active cooling system described herein includes a shield can mounted within a device enclosure that is adapted to shield at least one internal electrical component from RF radiation at a target shield frequency. The shield can includes input holes and output holes on different side surfaces to provide air intake and air outtake through the shield can. The active cooling system further includes a fan within the device enclosure and external to the shield can, the fan adapted to circulate air along a target path throughout both the input holes and the output holes of the shield can while circulating throughout the device enclosure.

In another example cooling system according to any preceding active cooling system, the input holes are formed in a first side surface of the shield can and the output holes are formed in a second side surface of the shield can. The first side surface and the second side surface of the shield can define a thinnest dimension of the shield can.

In yet another example cooling system of any preceding active cooling system a surface area of openings formed by the input holes on the first side surface exceeds a surface area formed by non-open areas of the first side surface.

In still yet another example cooling system of any preceding active cooling system, the shield can further includes a body portion mounted to a PCBA within the device enclosure and a fence portion including the input holes and the output holes. The fence portion is configured for attachment to the body portion.

An example system disclosed herein includes a means for determining an airflow path across a PCBA extending within a plane substantially parallel to a direction of gravity and a means for placing a shield can within the airflow path, the shield can having input holes and output holes in-line with the airflow path on different side surfaces of the shield can.

The implementations described herein are implemented as logical steps in one or more computer systems. The logical operations may be implemented (1) as a sequence of processor-implemented steps executing in one or more computer systems and (2) as interconnected machine or circuit modules within one or more computer systems. The implementation is a matter of choice, dependent on the performance requirements of the computer system being utilized. Accordingly, the logical operations making up the implementations described herein are referred to variously as operations, steps, objects, or modules. Furthermore, it should be understood that logical operations may be performed in any order, unless explicitly claimed otherwise or a specific order is inherently necessitated by the claim language. The above specification, examples, and data, together with the attached appendices, provide a complete description of the structure and use of exemplary implementations.

What is claimed is:

1. A system comprising:
   a printed circuit board assembly (PCBA) extending within a plane substantially perpendicular to a direction of gravity;
   a shield can attached to the PCBA, the shield can including a top portion and one or more sidewalls extending between the top portion and the PCBA, the one or more sidewalls including a step including a first portion substantially parallel to the PCBA and a second portion substantially perpendicular to the PCBA, the top portion and the one or more sidewalls being adapted to shield at least one internal electrical component from radiation at a target shield frequency, the one or more sidewalls including input holes and output holes positioned to facilitate airflow through the shield can in a direction substantially parallel to the PCBA, the input holes and the output holes being formed in both the first portion and the second portion of the step in the one or more sidewalls;
   an enclosure attached to the PCBA and encompassing the shield can, wherein a gap between the top portion of the shield can and the enclosure has a height smaller than a corresponding height of the shield can relative to the PCBA such that an airflow within the enclosure is substantially directed through the shield can rather than through the gap; and
   a fan within the enclosure and external to the shield can, the fan adapted to generate the airflow along a target path in the direction substantially parallel to the PCBA and through both the input holes and the output holes of the shield can while circulating the airflow throughout the enclosure.

2. The system of claim 1, wherein the input holes are formed in a first side surface of the shield can and the output holes are formed in a second side surface of the shield can, the first side surface and the second side surface defining a thinnest dimension of the shield can.

3. The system of claim 1, wherein the input holes and the output holes have a maximum diameter equal to or less than a smallest diameter sufficient to block transmission of RF waves of the target shield frequency.

4. The system of claim 1, wherein the shield can comprises:
   a fence portion mounted to the PCBA; and
   a body portion including the input holes and the output holes, the fence portion configured for attachment to the body portion.

5. The system of claim 1, wherein at least one of the input holes and the output holes are formed along the first portion of the step substantially perpendicular to the PCBA.

6. The system of claim 1, wherein the input holes are formed on a first side surface of the shield can and the output holes are formed on a second side surface of the shield can, the first side surface and the second side surface being non-parallel to one another such that the airflow is along a substantially curved path through the shield can.

7. A method comprising:
   determining an airflow path created by a fan positioned within an enclosure, the airflow path being directed across a PCBA within the enclosure, the PCBA extending within a plane substantially parallel to a direction of gravity; and
   placing a shield can inside the enclosure and within the airflow path, the shield can including:
   a top portion and one or more sidewalls adapted to shield and surround at least one internal electrical component, the one or more sidewalls extending between the top portion and the PCBA and having input holes and output holes in-line with the airflow path on different side surfaces of the shield can, the one or more sidewalls including a step including a first portion substantially parallel to the PCBA and a second portion substantially perpendicular to the PCBA, the input holes and the output holes being formed in both the first portion and the second portion of the step, the shield can having a height relative to the PCBA that is greater than a corresponding height of a gap between the shield can and the enclosure such that the airflow path is substantially directed through the shield can rather than through the gap.

8. The method of claim 7, wherein the input holes are formed in a first side surface of the shield can and the output holes are formed in a second side surface of the shield can, the first side surface and the second side surface defining a thinnest dimension of the shield can.

9. The method of claim 8, wherein a surface area of openings formed by the input holes on the first side surface exceeds a surface area formed by non-open areas of the first side surface.

10. The method of claim 7, wherein the input holes and the output holes have a maximum diameter equal to or less than a smallest diameter sufficient to block transmission of RF waves of a target shield frequency.

11. The method of claim 7, wherein the shield can includes a fence portion mounted to the PCBA and a body portion including the input holes and the output holes, the fence portion configured for attachment to the body portion.

12. The method of claim 7, wherein at least one of the input holes and the output holes are formed along the first portion of the step substantially perpendicular to the PCBA.

13. An apparatus comprising:
a shield can included within a device enclosure, the shield can including:
a top portion and one or more sidewalls extending between the top portion and the PCBA, the top portion and the one or more sidewalls being adapted to shield at least one internal electrical component from RF radiation at a target shield frequency, the one or more sidewalls including input holes and output holes on different side surfaces to provide air intake and air outtake through the shield can, wherein the one or more sidewalls further include a step having a first portion substantially parallel to the PCBA, the first portion being positioned between a second portion and a third portion, the second portion and the third portion each being substantially perpendicular to the PCBA, the input holes and the output holes being formed in both the first portion and the second portion of the step.

14. The apparatus of claim 13, wherein the input holes are formed in a first side surface of the shield can and the output holes are formed in a second side surface of the shield can, the first side surface and the second side surface defining a thinnest dimension of the shield can.

15. The apparatus of claim 14, wherein a surface area of openings formed by the input holes on the first side surface exceeds a surface area formed by non-open areas of the first side surface.

16. The apparatus of claim 13, wherein the shield can further includes:
a fence portion mounted to the PCBA within the device enclosure; and
a body portion including the input holes and the output holes, the fence portion configured for attachment to the body portion.

* * * * *